(12) United States Patent
Barton et al.

(10) Patent No.: US 6,794,218 B2
(45) Date of Patent: Sep. 21, 2004

(54) GLASS ATTACHMENT OVER MICRO-LENS ARRAYS

(75) Inventors: Eric J. Barton, Eden Prairie, MN (US); David S. Pitou, San Jose, CA (US); Patricia E. Johnson, Los Gatos, CA (US); Mohammad A. Safai, Los Altos, CA (US); James P. Roland, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/634,594

(22) Filed: Aug. 4, 2003

(65) Prior Publication Data

US 2004/0036069 A1 Feb. 26, 2004

Related U.S. Application Data

(62) Division of application No. 10/184,154, filed on Jun. 26, 2002, now Pat. No. 6,744,109.

(51) Int. Cl.$^7$ ................................................ H01L 21/00

(52) U.S. Cl. .......................................... 438/73; 438/65

(58) Field of Search ..................... 438/73, 65; 257/436, 257/452; 348/276

(56) References Cited

U.S. PATENT DOCUMENTS

6,285,064 B1    9/2001    Foster
6,594,916 B2 *    7/2003    Boroson et al. .............. 34/335

FOREIGN PATENT DOCUMENTS

| JP | 5110960 | | 4/1993 |
| JP | 2001157664 | | 6/2001 |
| JP | 02001157664 | * | 6/2001 |
| JP | 2001351997 | | 12/2001 |

* cited by examiner

Primary Examiner—Alexander Ghyka

(57) ABSTRACT

An imaging device such as a CMOS image sensor has a cover attached to a standoff surrounding a micro-lens array. Standard wafer processing fabricates the standoff (e.g., out of photoresist) and attaches the cover. The standoff maintains a gap over the micro-lenses. An adhesive attaches the cover to the standoff and can be kept away from the micro-lenses by a barrier having a structure similar to the standoff. Particles in the adhesive can prevent the adhesive from squeezing out from between the cover and the standoff during attachment. The standoff (and barrier if present) can provide a vent to prevent pressure in the gap from causing distortion or damage. The shape of the vent can prevent particles from entering the gap. Cutting the attached cover exposes electrical connections and can use preformed grooves in the cover to allow cutting of the cover without damaging underlying circuit elements.

21 Claims, 5 Drawing Sheets

GLASS ATTACHMENT OVER MICRO-LENS ARRAYS

This is a Divisional of application Ser. No. 10/184,154, filed on Jun. 26, 2002 now U.S. Pat. No. 6,744,109, the entire disclosure of which is incorporated herein by reference.

BACKGROUND

CMOS image sensors are known to provide efficient image capture systems with low operating power consumption. CMOS image sensors can also be manufactured using standard integrated circuit (IC) fabrication techniques and equipment, which permits a CMOS image sensor to be easily integrated into an IC with other CMOS circuitry. Accordingly, CMOS image sensors have become the image capture system of choice in many miniature and portable systems.

FIG. 1 shows a cross-sectional view of a CMOS image sensor 100 that includes an integrated circuit die 110 containing photosensitive regions 120. Photosensitive regions 120 are arranged in a two-dimensional array with each photosensitive region 120 corresponding to a pixel in an image. Such regions 120 can be made out of positive and negative doped regions in material such as bulk silicon or amorphous silicon, or depletion regions under polysilicon or metal gates. These regions 120 behave as a capacitor when given an electrical charge, but discharge electrons with photon impingement. The rate of discharge increases proportionally to the intensity of incident light. Circuitry (not shown), for example CMOS gates, among and around photosensitive regions 120 connects to photosensitive regions 120, measures the change in charge over a known period of time for each pixel, and generates signals representing an image formed on the surface of image sensor 100.

To improve light sensitivity, image sensor 100 incorporates micro-lenses 130. Micro-lenses 130 guide light from a wider area onto underlying photosensitive regions 120. In one configuration, each micro-lens 130 corresponds to a single photosensitive region 120 and has a hemispherical shape that focuses light on the corresponding photosensitive region 120. In another configuration, each micro-lens 130 is a half cylinder overlying a row or column of photosensitive regions 120 and focuses light onto the row or column of underlying photosensitive regions 120. In either case, micro-lenses 130 require an air gap above their convex optical surfaces to properly focus incident light.

One technique for forming an array of micro-lenses 130 such as illustrated in FIG. 1 begins by coating integrated circuit die 110 with a layer of a transparent photoresist. The photoresist is then patterned to form small regions corresponding to micro-lenses 130. After patterning, heating liquefies the photoresist, and the surface tension of the liquefied photoresist causes each region to take on a convex shape that remains when the photoresist solidifies.

A cover plate over micro-lenses 130 on image sensor 100 is generally desirable to protect micro-lenses 130 from contamination and damage. However, traditional methods using an adhesive to directly attach a cover plate to image sensor 100 are not compatible with micro-lenses 130 because the adhesive that attaches the cover plate fills the required air gap above micro-lenses 130. Accordingly, image sensor 100, after being cut from a wafer, is generally placed in a housing or package having a transparent cover that protects delicate features such as micro-lenses 130. Covering micro-lenses 130 only during or after packaging can subject image sensor 100 to damage or contamination when the wafer containing the image sensor is moved from wafer processing equipment, when the wafer is cut to separate dies, and when the die is packaged. In view of the limitations of current systems for protecting image sensors, structures and methods are desired for attaching a cover to an image sensor to protect the image sensor without interfering with the required air gap above micro-lenses.

SUMMARY

In accordance with an aspect of the invention, an image sensor has a glass plate or other transparent cover attached to a standoff that surrounds an array of micro-lenses. The standoff can be a ring of photoresist that is taller than the micro-lenses and maintains the required air gap over the micro-lenses while the transparent cover protects the micro-lenses and provides surfaces for optical coatings.

A fabrication process that attaches the cover can be performed at the wafer level using wafer-processing equipment. Accordingly, cover attachment can be performed in a clean room environment to avoid or minimize damage and contamination of the image sensor or micro-lens array before cover attachment. After attaching a plate to a wafer, the process cuts the plate to expose die pads for electrical connections. The standoff keeps the plate above the surface of the substrate, but the plate can further be grooved before attachment to the substrate to provide additional tolerance for cutting without damaging underlying circuit elements.

The application of adhesive that attaches the transparent cover to the standoff can be controlled to avoid applying adhesive to the micro-lenses. In particular, the adhesive can contain filler particles having a size approximately equal to the desired adhesive thickness to stop the adhesive from spreading onto the micro-lenses when pressure is applied during attachment of the cover. A barrier having a structure similar to the standoff can additionally or alternatively be formed between the standoff and the micro-lens array to prevent adhesive on the standoff from spreading onto the micro-lenses.

In accordance with a further aspect of the invention, the standoff (and barrier if present) can include a channel or vent that opens the air gap between the glass plate and the pixel array to the surroundings. The vent prevents thermal or external pressure changes from distorting or damaging the attached cover. The vent can be shaped to trap or prevent particles from entering and contaminating the micro-lens array.

One specific embodiment of the invention is an imaging device such as a CMOS image sensor. The imaging device includes: a substrate containing electrical elements; an array of lenses attached to the substrate; a standoff on the substrate and surrounding the array of lenses; and a transparent cover (e.g., glass plate) attached to the standoff and overlying the array of lenses. The standoff is generally taller than the lenses and made of a material such as photoresist, which is easily formed and processed using standard wafer processing equipment. The standoff can include a vent leading to a gap between the transparent cover and the array of lenses, and the vent can be shaped to permit pressure equalization but stop particles from reaching the gap and contaminating the imaging device. An adhesive attaches the cover and may contain filler particles having a size approximately equal to the adhesive thickness. An optional barrier can help stop adhesive from extending onto the lenses.

Another embodiment of the invention is a method for fabricating an imaging device such as a CMOS image sensor. The method includes: fabricating electrical components of the imaging device on a substrate; forming an array of lenses on the substrate; forming a standoff on the substrate and surrounding the array of lenses; and attaching a transparent cover to the standoff. The process can be conducted at the wafer level using standard wafer processing equipment. One process for forming the standoff deposits a layer of photoresist on the substrate, exposes selected regions of the photoresist to define the area of the standoff, and develops the photoresist to leave a portion of the photoresist from which the standoff is formed. Applying an adhesive to a top surface of the standoff and pressing the transparent cover onto the standoff attaches the transparent cover to the substrate.

In accordance with a further aspect of the invention, the adhesive used to attach the cover to the standoff contains filler particles such as glass balls having a size or diameter about equal to the desired adhesive thickness. The filler particles prevent the plate from being pressed into direct contact with the standoff and prevents the adhesive from being completely squeezed off of the standoff and onto nearby lenses.

The substrate can be a wafer processed to form multiple substantially identical integrated circuits, with the imaging device being one of the integrated circuits. On a wafer, a glass plate or other cover plate can be attached to the standoffs in all of the integrated circuits. Cutting the transparent cover removes portions of the transparent cover that overlie active circuitry in the substrate but still leaves an underlying portion of the substrate intact. The standoff provides a separation between the cover and the substrate and precut grooves on an underside of the plate can provide tolerance necessary to ensure that sawing the cover does not damage underlying circuitry. Further cutting of the wafer and the cover plate separates individual IC dies.

BRIEF DESCRIPTION OF THE DRAWINGS

Use of the same reference symbols in different figures indicates similar or identical items.

DETAILED DESCRIPTION

In accordance with an aspect of the invention, an image sensor has a glass plate or other protective cover attached to a standoff to protect underlying micro-lenses and provide an air gap above the micro-lenses. The standoff can be formed from photoresist or similar material that is deposited and patterned during wafer processing to fabricate integrated circuits. The glass plate or cover plate can be attached and cut using wafer processing equipment to reduce costs and avoid damaging or contaminating the image sensor before the protective cover is attached.

Figure 1:
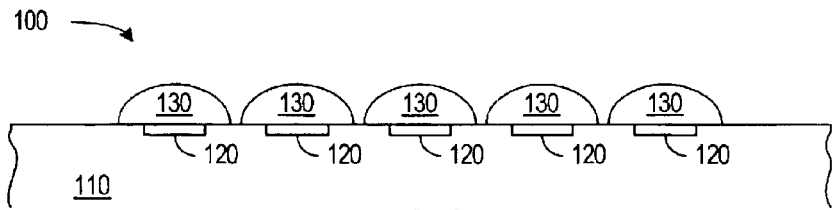
FIG. 1 shows a cross-sectional view of a conventional CMOS image sensor.
Figure 2A:
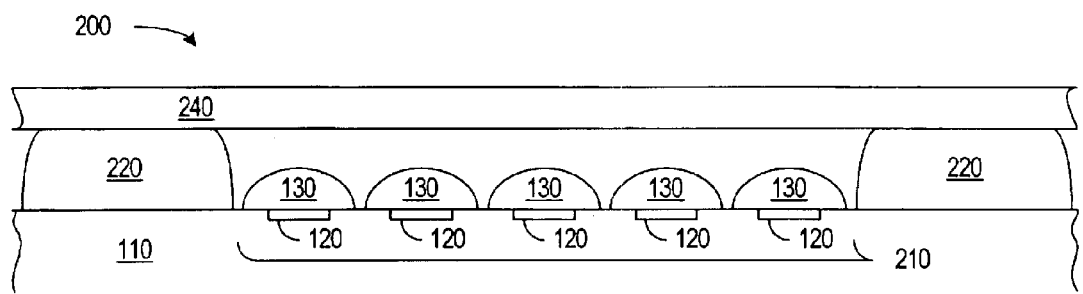
FIGS. 2A and 2B respectively show cross-sectional and plan views of a CMOS image sensor having a standoff for a cover in accordance with an embodiment of the invention.
Figure 2B:
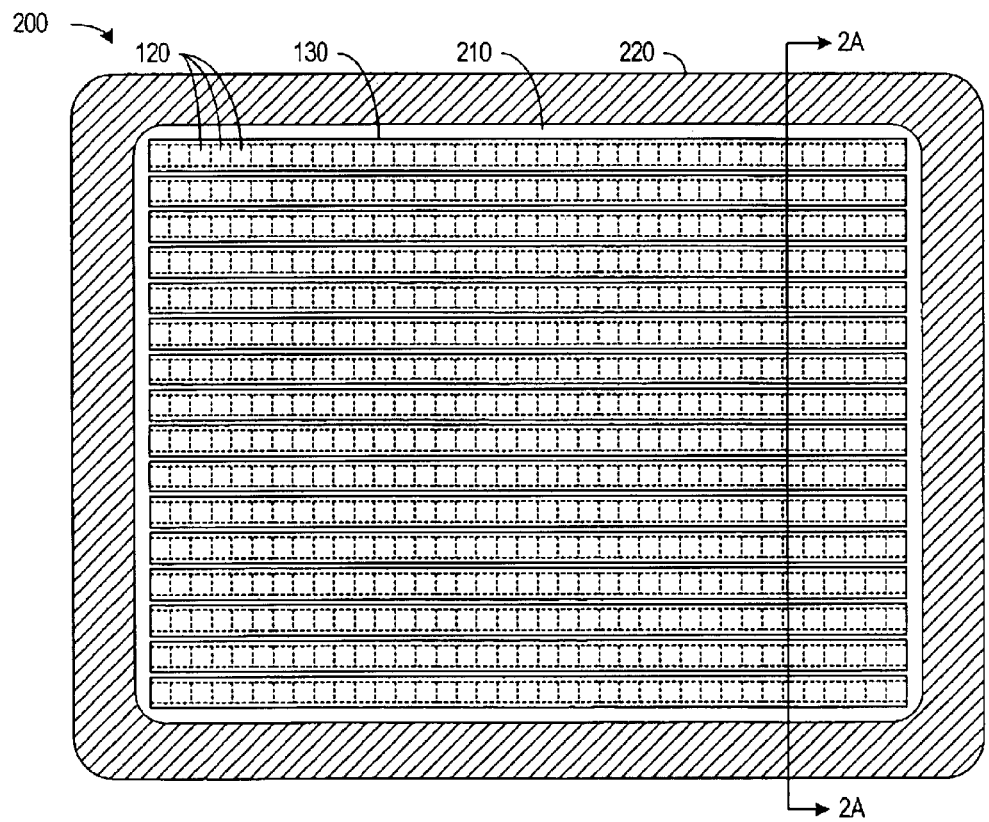

FIGS. 2A and 2B respectively show a cross-sectional view and a plan view of a CMOS image sensor 200 in accordance with an embodiment of the invention. CMOS image sensor 200 is formed in and on a semiconductor substrate 110 and includes a pixel array 210 surrounded by a standoff 220. In one embodiment, substrate 110 is a processed silicon wafer containing several integrated circuits forming other image sensors (not shown). Alternatively, substrate 110 can be a die after separation from a wafer.

Pixel array 210 is a two-dimensional array of pixel sensors that can be of standard construction. Each pixel sensor includes a photosensitive region 120. The size and the number of pixel sensors in pixel array 210 determine the image resolution achievable with image sensor 200, and pixel array 210 typically includes hundreds or thousands of pixel sensors per row or column.

Overlying photosensitive region 120 is an array of micro-lenses 130. In FIG. 2A, micro-lenses 130 are cylindrical lenses, and each micro-lens 130 overlies and focuses light onto a row of photosensitive regions 120. Alternatively, each photosensitive region 120 could have a separate micro-lens, or each micro lens could overly a different set (e.g., a row) of photosensitive regions. A cylindrical lens provides efficient focusing of light on a row of photosensitive regions when the photosensitive regions have straight borders and are nearly or directly adjacent to each other. FIG. 2A is a cross-section along a line 2A—2A, which is perpendicular to the axes of the cylindrical micro-lenses 130 illustrated in the plane view in FIG. 2B.

In an exemplary embodiment, each micro-lens 130 is typically about 4 to 6 µm wide and has a height of about 1 µm above substrate 110. Each micro-lens 130 further has a convex upper surface that focuses incident light from a wider area onto the area of the corresponding photosensitive regions 120. Such micro-lenses can be fabricated from transparent photoresist such as MFR-385M positive tone i-line reflowable photoresist that is manufactured by JSR Microelectronics or other transparent material. The MFR-385M material is comprised of a solution of phenolic/epoxy/melamine resins with a photoreactive compound and ethyl lactate and propyleneglycol monoethylether acetate solvents. Alternatively, micro-lenses 130 can be gradient index lenses. A gradient index lens normally has a flat surface upper surface but has a refractive index that varies spatially as required to focus light onto the corresponding photosensitive regions 120.

Standoff 220 surrounds pixel array 210 and is generally plateau-shaped or hemispherical with a top surface to which a glass plate 240 attaches. Standoff 220 is taller than micro-lenses 130 so that an air gap is between glass 240 and micro-lenses 130, when glass 240 is atop standoff 220. In a typical embodiment, standoff 220 is about 10 to 12 µm high and about 600 µm wide. But, the geometry of standoff 220 can be varied widely depending on factors such as the sized of pixel array 210, the height of micro-lenses 130, and the properties of the material used in standoff 220.

Standoff 220 is preferably made of high viscosity photoresist. In an exemplary embodiment, the photoresist is AZ nLOF 2070 negative tone i-line photo resist manufactured by Clariant Corporation/AZ Electronic Materials, which is compatible with the materials already deposited on the wafer and allows the creation of features approximately 10 micron thick. Using photoresist for standoff 220 simplifies the fabrication process. Patterning processes for photoresist are well known in the art and generally consist of spinning on the photoresist to a desired thickness, exposing selected regions of the photoresist to an appropriate frequency light, and then developing the photoresist to remove unwanted portions (either the exposed or unexposed regions depending on the type of photoresist). Optionally, the photoresist forming standoff 220 can be baked or otherwise hardened to improve the strength and durability of standoff 220.

Using photoresist for standoff 220 permits forming standoff 220 after or before the formation of micro-lenses 130. In an exemplary fabrication process, a first layer of photoresist is spun on a processed wafer to a thickness suitable for micro-lenses 130 and exposed to define regions corresponding to micro lenses 130. The first photoresist layer is then developed and heated. Heating liquefies the photoresist regions giving micro-lenses 130 their desired shape, which micro-lenses 130 retain after cooling.

A second layer of photoresist is then spun on to a thickness suitable for standoff 220 and then exposed to define a region corresponding to standoff 220. The resulting structure can then be developed to remove unwanted photoresist regions and leave regions corresponding standoff 220. The second photoresist is preferably compatible with the first photoresist layer (e.g., both layers are positive photoresist or both layers are negative photoresist) so that exposure and developing of the second photoresist layer leaves the micro-lenses unharmed.

A photoresist standoff 220 could alternatively be formed before micro-lenses 130. In this case, the heating that liquefies and shapes micro-lenses 130 would generally have a similar effect on photoresist standoff 220.

Standoff 220 could alternatively be formed of a material other than a photoresist, but patterning other materials generally requires additional processing steps. The additional processing steps may include, for example, deposition of the standoff material such as a metal, a semiconductor, or an insulator before depositing photoresist, etching the material after patterning the photoresist to form a mask, and stripping the photoresist mask after etching. Such additional processing steps increase processing cost and must be chosen and controlled to avoid damaging underlying structures of image sensor 200. Micro-lenses 130 could be formed after formation of standoff 220 to prevent the processes that form standoff 220 from damaging to micro-lenses 130.

After formation of micro-lenses 130 and standoff 220, an adhesive such as NOA 68 made by Norland Products, Inc. or other UV or UV-visible curable adhesive is applied to the top of standoff 220. Processes such as known for bonding layers of LCD panels can be used to selectively apply the adhesive to standoffs 220, place cover 240 on standoff 220, and cure the adhesive. One exemplary process is described further below.

In an exemplary embodiment of the invention, cover 240 is a plate of a glass such as a 500-μm thick plate of PYREX, CORNING 1737, or CORNING EAGLE 200 and has a coefficient of thermal expansion (CTE) about equal to that of silicon or substrate 110, but other transparent materials such as other glasses or plastics may also be suitable. Cover 240 may have optical coatings such as an anti-reflective coating or an infrared filter preformed before cover 240 is attached to standoff 220. Such coatings can be alternatively applied after attaching cover 240 to standoff 220.

In one fabrication process, cover 240 is a single plate of glass or other material that covers all of the image sensors fabricated on a wafer. Alternatively, cover 240 can be one of several strips, with each strip covering the image sensors in a row or column ICs formed on a wafer, or glass 240 can be a glass piece sized for and applied to an individual image sensor. As described further below, cutting of glass 240 may be necessary to expose electrical contacts on a surface of substrate 110.

In an alternative embodiment of the invention, standoff 220 is replaced with a double rim standoff having an outer rim and an inner rim. Adhesive applied to the top of the outer rim attaches a glass plate to the outer rim, and a gap between the inner and outer rims traps adhesive that may spread from the top of standoff 220 and thereby prevents the adhesive from extending into the pixel array 210. The inner rim thus acts as a barrier to control the extent of the adhesive.

Figure 3A:
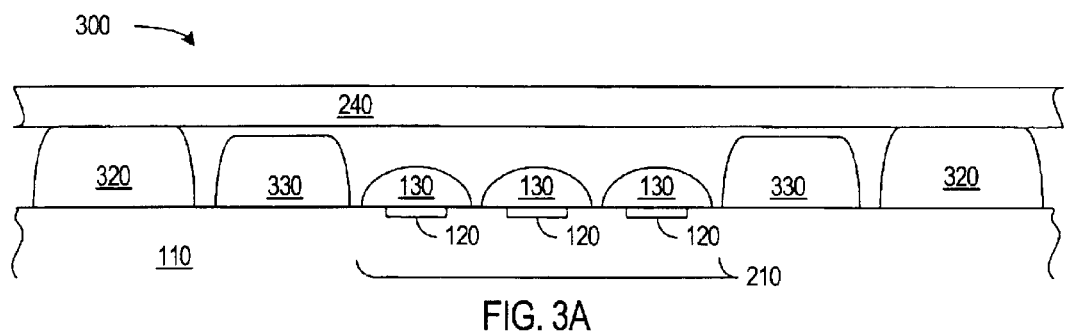
FIGS. 3A and 3B respectively show cross-sectional and plan views of a CMOS image sensor having a standoff and a barrier for attachment of a cover in accordance with an embodiment of the invention.
Figure 3B:
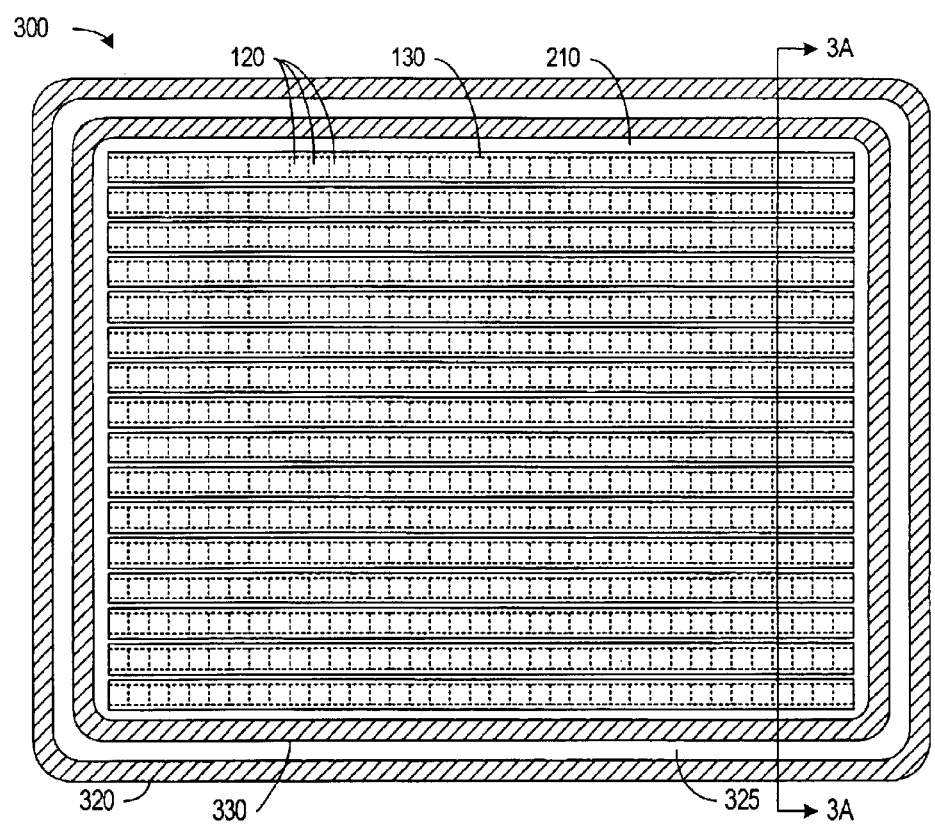

FIGS. 3A and 3B illustrate a CMOS image sensor 300 having a double rim structure including a standoff 220 and a barrier 330. Image sensor 300 also contains elements as described above in connection with FIGS. 2A and 2B. Barrier 330 can be of the same construction as standoff 220 or could be shorter than standoff 220 to avoid application of adhesive to the top of barrier 330. Accordingly, barrier 330 can be formed from the same photoresist layer as used to form standoff 220 or from a photoresist layer slightly thinner than the photoresist used to form standoff 220.

Figure 4:
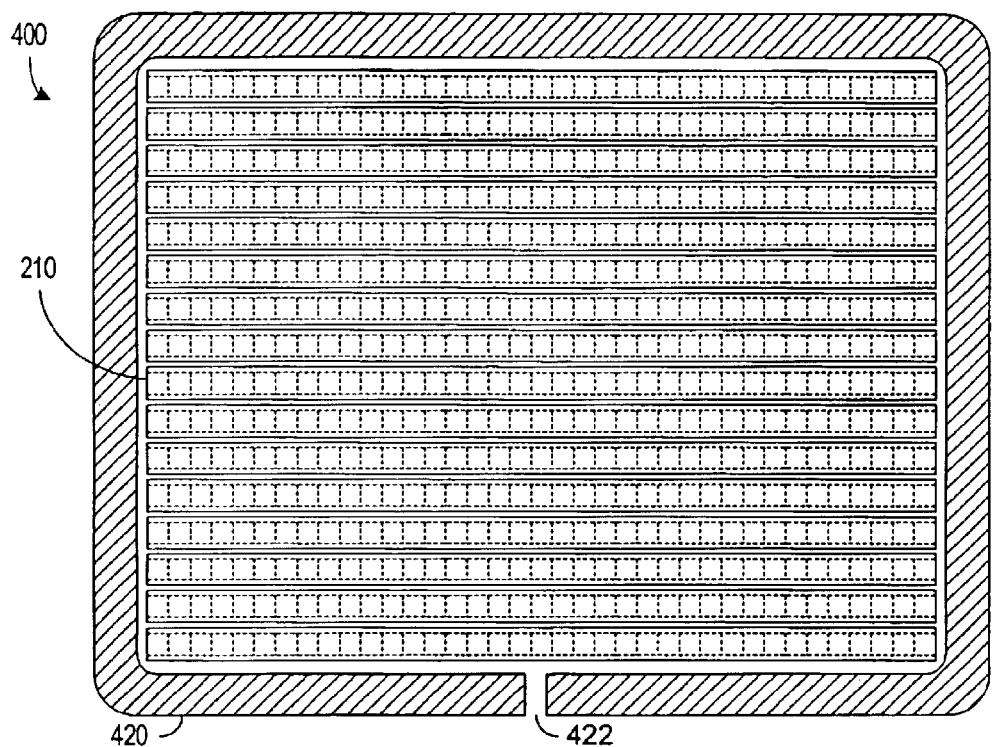
FIGS. 4 and 5 show plan views of CMOS image sensors having vents in accordance with alternative embodiments of the invention.

FIG. 4 is a plan view of an image sensor 400 in accordance with another embodiment of the invention. Image sensor 400 has a standoff 420 that provides a vent 422 leading to the air gap between pixel array 210 and the overlying cover. Adhesive applied to standoff 420 for glass attachment is kept away from vent 422 so that after attaching the cover, gases can still flow into and out of the air gap. Accordingly, with the cover attached to standoff 420, pressure in the air gap can equalize with the external pressure on image sensor 400. Accordingly, image sensor 400 is not subject to distortion or damage that might result from pressure in a sealed air gap.

Figure 5:
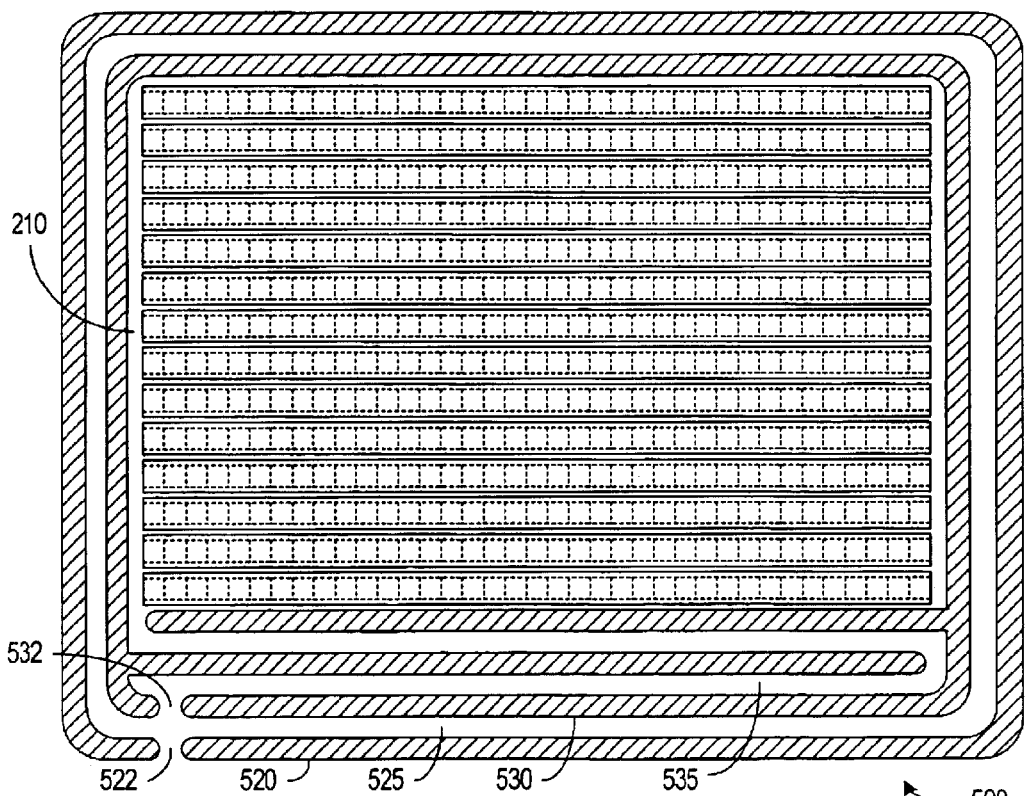

FIG. 5 illustrates an image sensor 500 having a venting system with a more complicated gas channel 535 that is designed to trap dust and particles and prevent contamination of pixel array 210. In the illustrated embodiment of FIG. 5, image sensor 500 has a double rim structure including a standoff (or outer rim) 520 and a barrier (or inner rim) 530. Standoff 520 has an opening 522 for gas flow. Barrier 530 has an opening 532, and channel 535 through barrier 532 takes one or more turns before reaching pixel array 210.

Figure 6:
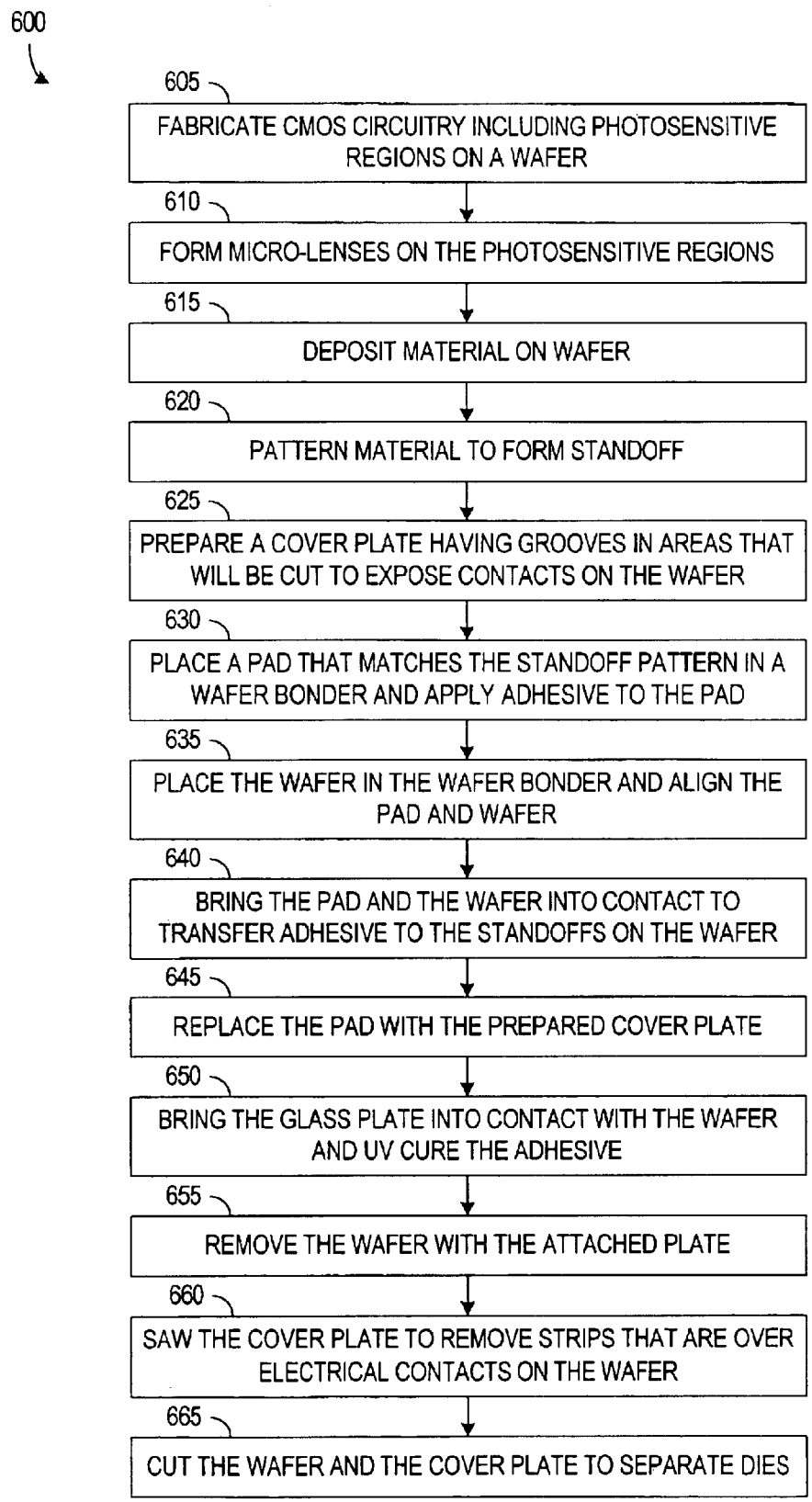
FIG. 6 is a flow diagram of a fabrication process for an image sensor in accordance with an embodiment of the invention.

FIG. 6 is a flow diagram of a fabrication process 600 for an image sensor in accordance with an embodiment of the invention. In process 600, an initial step 605 uses conventional CMOS integrated circuit manufacturing techniques to form electrical components of image sensor ICs in and on a wafer 110. Fabrication step 610 then forms micro-lens arrays on the image sensor ICs. The micro-lens arrays can be formed using conventional techniques such as forming the micro-lenses from patterned photoresist that is heated to produce a convex optical shape. Alternatively, altering the refractive index of a layer using silicon-oxide and silicon-nitride can form gradient index micro-lenses.

Fabrication step 615 deposits the material for the standoffs, e.g., by spinning on a photoresist to a desired thickness. A conventional photolithography process 620 then patterns the material to form the standoffs with or without an inner barrier surrounding the pixel arrays in the image sensor ICs. Photolithography process 620 can provide the standoff and barrier with any desired shape with or without vent channels.

Figure 7:
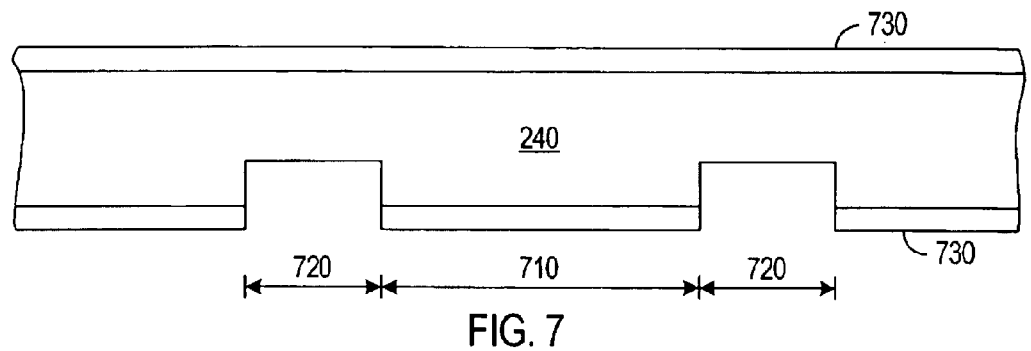
FIG. 7 is a cross-sectional view of a cover plate having precut grooves that provide tolerance for sawing the cover plate without damaging underlying circuit elements.

Step 625 prepares a cover plate 240 for attachment to the wafer 110. Cover plate 240 is generally about the same size as wafer 110 and typically made of a material having a CTE that is similar to the CTE of wafer 110. An optical coating 730 such as an IR filter or an anti-reflective coating can be deposited on either or both surfaces of cover plate 240 as illustrated in FIG. 7. Additionally, grooves 720 can be cut in the bottom surface of cover plate 240 to provide additional tolerance for a process described below for sawing cover 240 to expose underlying electrical contacts. In an exemplary embodiment, cover plate 240 is a 500-$\mu$m thick plate of a glass such as PYREX. Grooves 720 have a width corresponding to integrated areas containing electrical contacts and are about 800±50 $\mu$m wide and about 200±25 $\mu$m deep in an exemplary embodiment of the invention.

Figure 8:
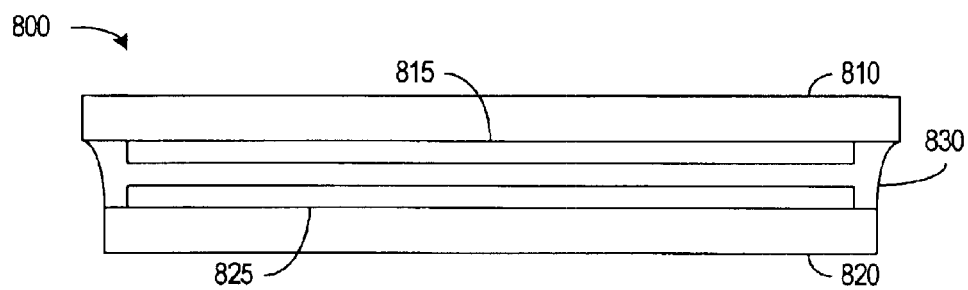
FIG. 8 illustrates a wafer bonder suitable for attaching a cover plate to a wafer containing CMOS image sensors in accordance with an embodiment of the invention.

Once processed wafer 110 and cover plate 240 are ready, an exemplary attachment process including steps 630, 635, 640, and 645 attaches wafer 110 and cover plate 240. The attachment process can use wafer-processing equipment such as the wafer bonder 800 illustrated in FIG. 8. Wafer bonder 800 includes an upper stage and collar 810, a lower stage and collar 820, and a vacuum system 830 for bringing a cover plate 240 in a station 815 into contact with wafer 110 in a station 825.

Step 630 of the exemplary attachment process places in station 815 a pad that has a raised pattern matching the desired pattern of adhesive on standoffs 220 and applies adhesive to the raised areas of the pad. Adhesive can be applied to the pad by coating a glass plate with a uniform layer of adhesive, placing the coated plate in station 825, and bring the pad in station 815 into contact with the glass plate in station 825 to transfer adhesive to the raised pattern. The thickness of the adhesive on the coated plate can control the amount of adhesive transferred to the pad.

After removal of the coated plate from wafer bonder 800, step 635 places wafer 110 in station 825 and aligns the pad with wafer 110. The pad and wafer 110 are typically opaque so that the alignment process may require a vision system capable of viewing between the pad and wafer 110. Once the pad and wafer 110 are aligned, step 640 brings the pad into contact with wafer 110 to transfer adhesive from the pad to standoffs 220 on wafer 110.

Figure 9:
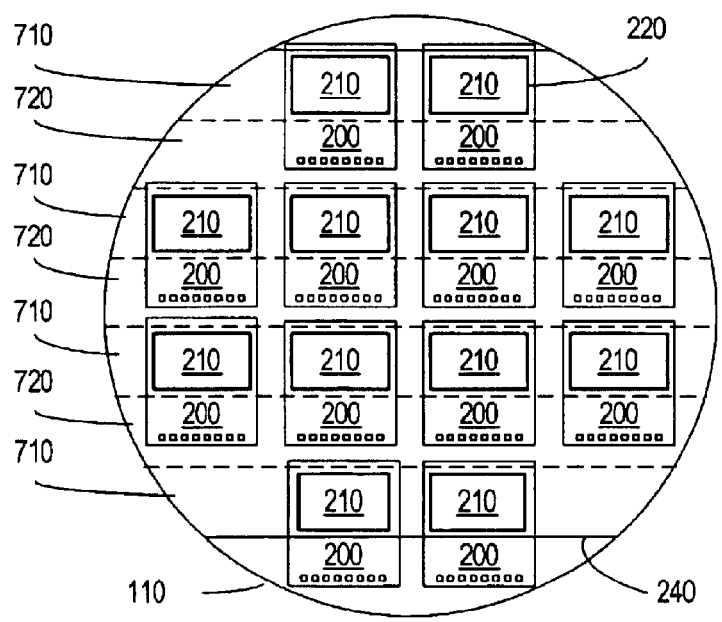
FIG. 9 illustrates cutting of a cover plate attached to a wafer using a process in accordance with an embodiment of the invention.

Step 645 replaces the pad in station 815 with the prepared cover plate 240 and aligns cover plate 240 with wafer 110. Since cover plate 240 is transparent, this alignment can use a top-view or side-view vision system. FIG. 9 shows the desired alignment of cover plate 240 and wafer 110 where uncut regions 710 of cover plate 240 overlie pixel arrays 210 and contact standoffs 220 of CMOS image sensor ICs 200 on wafer 110. Grooves 720 in cover plate 240 overlie circuit area containing electrical contacts that must be accessible for use and/or packaging of CMOS image sensor ICs 200.

With wafer 110 and cover plate 240 properly aligned, the wafer bonder brings cover plate 240 and wafer 110 into contact under a vacuum. Filler particles in the adhesive can have a size or diameter selected to control the minimum thickness of the adhesive so that the process of bringing cover plate 240 and wafer 110 into contact does not squeeze all of the adhesive out from between cover plate 240 and standoffs 220.

An a curing process such as a UV curing cures or tack-cures the adhesive so that cover plate 240 and wafer 110 are suitably bonded for removal from the wafer bonder in step 655. Once wafer 110 and cover plate 240 are thus bonded, the bonded assembly can be removed to a less clean environment with cover plate 240 protecting the pixel arrays from contamination or damage.

As illustrated in FIG. 9, the attached cover plate 240 overlies contacts that must be exposed for electrical connections. A cutting process 660 saws the glass plate to expose the die contacts. Conventional precision sawing equipment can currently cut to a desired depth with a tolerance of about ±25 $\mu$m, so that the error in the depth being cut can be greater than the high of the standoff 220. To prevent sawing process 660 from damaging underlying circuitry, sawing process 660 cuts to a depth sufficient to reach grooves 720, e.g., 25 to 50 $\mu$m deeper than the top of grooves. Grooves 720 in cover plate 240 are sufficiently deep, e.g., 100 $\mu$m deep, to prevent the saw from reaching and damaging to the underlying circuitry even for the worst-case error in sawing depth.

Returning to FIG. 6, a further wafer sawing process 680 cuts through the wafer and attached glass along scribe lines to separate individual dies. The dies can then be packaged using conventional techniques to provide convenient electrical connections.

The fabrication process 600 can be performed in standard wafer fabrication facilities as part of a standard integrated circuit manufacturing cycle and therefore can reduce the overall costs of forming assemblies including image sensors. Performing the glass attach operation during wafer fabrication also provides a very low contaminant level in the image sensor. Additionally, wafer fabrication techniques provide precise control of the flatness of the cover plate 240 relative to the wafer 110 and may improved optical performance.

A cover in accordance with the invention protects the delicate features of an image sensor and allows direct contact to the glass surface for any lens gapping mechanisms or camera housing designs. The glass also simplifies cleaning of contamination that occurs after the wafer fabrication processes.

Although the invention has been described with reference to particular embodiments, the description is only an example of the invention's application and should not be taken as a limitation. For example, although the above embodiments employ CMOS image sensors, other devices employing micro-lens arrays can also benefit from embodiments of the invention that provide a glass plate or cover to protect the micro-lens array. Additionally, although this documents describes some specific materials and dimensions for particular structures, such descriptions merely provide suitable examples and are not intended as a limitation. Various other adaptations and combinations of features of the embodiments disclosed are within the scope of the invention as defined by the following claims.

What is claimed is:

1. A method for fabricating an imaging device, comprising:

fabricating electrical components of the imaging device on a substrate;

forming an array of lenses on the substrate;

forming a standoff on the substrate and surrounding the array of lenses;

forming a barrier on the substrate between the standoff and the array of lenses; and attaching a cover to the standoff using an adhesive on a top surface of the standoff, wherein the barrier blocks the adhesive from extending onto the array of lenses.

2. The method of claim 1, wherein the substrate is a wafer, and fabricating the electrical components comprises processing the wafer to form a plurality of substantially identical integrated circuits, the imaging device being one of the integrated circuits.

3. The method of claim 2, further comprising:
forming a plurality of arrays of lenses respectively on the plurality of the integrated circuits;
forming a plurality of standoffs respectively surrounding the plurality of arrays of lenses; and
attaching the cover to the plurality of standoffs.

4. A method for fabricating an imaging device, comprising:
fabricating electrical components of the imaging device on a substrate;
forming an array of lenses on the substrate;
forming a standoff on the substrate and surrounding the array of lenses;
attaching a cover to the standoff; and
cutting the cover while the cover is attached to the standoff, wherein cutting the cover removes a portion of the cover that overlies active circuitry in the substrate, and leaves an underlying portion of the substrate intact.

5. The method of claim 4, further comprising cutting grooves in an underside of the cover before attaching the underside of the cover to the standoff, wherein cutting to remove the portion of the cover overlying active circuitry cuts from a topside of the cover down to the grooves.

6. The method of claim 2, further comprising sawing the wafer and the cover to form separated dies.

7. The method of claim 1, wherein forming the standoff comprises:
depositing a layer of photoresist on the substrate;
exposing the photoresist to define an area corresponding to the standoff;
developing the photoresist to leave a portion of the photoresist from which the standoff is formed.

8. A method for fabricating an imaging device, comprising:
fabricating electrical components of the imaging device on a substrate;
forming an array of lenses on the substrate;
forming a standoff on the substrate and surrounding the array of lenses; and
attaching a cover to the standoff, wherein attaching the cover comprises:
applying an adhesive to a top surface of the standoff; and
pressing the cover onto the standoff so that the adhesive binds the cover to the standoff, wherein the adhesive contains filler particles having a size about equal to a thickness of the adhesive between the cover and the standoff after the pressing step.

9. The method of claim 1, further comprising forming an optical coating on the cover before attaching the cover to the standoff.

10. The method of claim 1, wherein the barrier is shorter than the standoff.

11. The method of claim 1, wherein the standoff includes a vent, and attaching the cover to the standoff leaves the vent open to permit gas flow to a gap between the cover and the array of lenses, the gas flow preventing external pressure changes from distorting the cover.

12. The method of claim 11, wherein the standoff and the barrier form a channel for the gas flow, and the channel includes one or more turns.

13. The method of claim 4, further comprising:
fabricating the electrical components of a second imaging device on the substrate
forming a second array of lenses for the second imaging on the substrate; and
forming a second standoff on the substrate and surrounding the second array of lenses, wherein:
attaching the cover also attaches the cover to the second standoff; and
cutting the cover leaves separate portions of the cover over each of the imaging devices.

14. The method of claim 8, further comprising forming a barrier on the substrate between the standoff and the array of lenses, wherein the barrier blocks the adhesive from extending onto the array of lenses during pressing of the cover onto the standoff.

15. The method of claim 8, wherein the substrate is a wafer, and fabricating the electrical components comprises processing the wafer to form a plurality of substantially identical integrated circuits, the imaging device being one of the integrated circuits.

16. The method of claim 15, further comprising:
forming a plurality of arrays of lenses respectively on the plurality of the integrated circuits;
forming a plurality of standoffs respectively surrounding the plurality of arrays of lenses; and
attaching the cover to the plurality of standoffs.

17. The method of claim 16, further comprising cutting the cover while the cover is attached to the standoffs, wherein cutting the cover removes a portion of the cover that overlies active circuitry in the substrate and leaves separate portions of the cover respectively overlying the arrays of lenses.

18. A method for fabricating an imaging device, comprising:
fabricating electrical components of the imaging device on a substrate;
forming an array of lenses on the substrate;
forming a standoff on the substrate and surrounding the array of lenses, the standoff including a vent and a channel for the gas flow, the channel including one or more turns; and
attaching a cover to the standoff, wherein attaching the cover leaves the vent and the channel open to permit gas flow to a gap between the cover and the array of lenses, the gas flow preventing external pressure changes from distorting the cover.

19. The method of claim 18, wherein the substrate is a wafer, and fabricating the electrical components comprises processing the wafer to form a plurality of substantially identical integrated circuits, the imaging device being one of the integrated circuits.

20. The method of claim 19, further comprising:
forming a plurality of arrays of lenses respectively on the plurality of the integrated circuits;
forming a plurality of standoffs respectively surrounding the plurality of arrays of lenses; and
attaching the cover to the plurality of standoffs.

21. The method of claim 20, further comprising cutting the cover while the cover is attached to the standoffs, wherein cutting the cover removes a portion of the cover that overlies active circuitry in the substrate and leaves separate portions of the cover respectively overlying the arrays of lenses.

* * * * *